United States Patent [19]

Iida

[11] Patent Number: 4,615,945

[45] Date of Patent: Oct. 7, 1986

[54] COPPER-FOILED LAMINATE FOR BASE PLATE

[75] Inventor: Tamaki Iida, Tokyo, Japan

[73] Assignee: Shin-Etsu Chemical Co., Ltd., Tokyo, Japan

[21] Appl. No.: 701,422

[22] Filed: Feb. 14, 1985

[30] Foreign Application Priority Data

Feb. 14, 1984 [JP] Japan ................................. 59-25892

[51] Int. Cl.$^4$ ......................... B32B 15/04; B32B 15/20
[52] U.S. Cl. .................................... 428/335; 427/96; 428/336; 428/469; 428/698; 428/701; 428/901
[58] Field of Search ............... 428/701, 901, 469, 698, 428/336, 335; 427/96

[56] References Cited

U.S. PATENT DOCUMENTS

| | | | |
|---|---|---|---|
| 4,293,617 | 10/1981 | Nagy | 428/469 |
| 4,431,707 | 2/1984 | Burns et al. | 428/901 X |
| 4,482,209 | 11/1984 | Grewal et al. | 428/469 X |

*Primary Examiner*—Thomas J. Herbert
*Attorney, Agent, or Firm*—Toren, McGeady, Stanger, Goldberg & Kiel

[57] ABSTRACT

A copper-foiled laminate suitable as a base plate of printed circuit boards and the like electronic parts. The laminate is composed of an aluminum plate as the base, a layer of aluminum oxide formed on the aluminum plate, a layer of an amorphous silicon carbide formed on the aluminum oxide layer and a copper foil adhesively bonded to the surface of the silicon carbide layer so that the laminate has a high thermal conductivity providing a heat dissipative surface essential in high-performance electronic parts.

4 Claims, No Drawings

COPPER-FOILED LAMINATE FOR BASE PLATE

BACKGROUND OF THE INVENTION

The present invention relates to a copper-foiled laminate for base plate or, more particularly, to a copper-foiled laminate used as a base plate or substrate plate for various kinds of electronic devices such as printed circuit boards, in which high thermal conductivity is ensured.

Copper-foiled laminates as a base plate of electronic devices have been under continuous improvements along with the development of the electronic industry and the production thereof has grown to such an extent as to cover an important part of the electronic parts industry. Along with the rapidly increasing density of integration of the integrated circuits from ICs to LSIs, the copper-foiled laminates as a base plate are also under growing requirements to satisfy severer and severer thermal conditions and it is now desired that the base plate has a very high thermal conductivity to provide a heat dissipative surface.

As is known, a large part of the conventional copper-foiled laminates for base plate is formed of a synthetic resin such as a phenolic resin, epoxy resin and the like with limited resistances against heat, chemicals and water or moisture. The use of a glass fiber-reinforced synthetic resin has of course contributed to the improvement of the heat resistance to some extent but such a means is far from satisfactory when the copper-foiled laminate is desired to have a greatly increased thermal conductivity and to serve as a heat dissipative surface.

Further, the laminates as finished have sometimes limited cleanness on the surface so that the degree of lamination of the parts mounted on the base plate is also under limitation and consequently the range of the applicability thereof is unavoidably not broad enough.

SUMMARY OF THE INVENTION

An object of the present invention is therefore to provide a copper-foiled laminate usable as a base plate having a greatly increased thermal conductivity without the problems in the prior art copper-foiled laminates.

Namely, the copper-foiled laminate of the present invention completed as a result of the extensive investigation of the inventor comprises: an aluminum plate as a base; a layer of aluminum oxide formed on the surface of the aluminum plate; a layer of an amorphous silicon carbide formed on the layer of the aluminum oxide; and a copper foil bonded to the layer of the amorphous silicon carbide.

DETAILED DESCRIPTION OF THE PREFERRED EMBODIMENTS

As is mentioned above, the base material of the inventive copper-foiled laminate is a plate of aluminum which is a metal of outstanding inexpensiveness having a high thermal conductivity and the inventive copper-foiled laminate is prepared by providing the aluminum plate with three successive layers of aluminum oxide, amorphous silicon carbide and copper foil.

The first coating layer on the aluminum base plate is formed of aluminum oxide which can be obtained by several known methods. For example, an aluminum oxide film can be formed by a conventional electrolytic anodization of the aluminum plate in an acidic electrolyte bath. Beside the wet process of the electrolytic anodization, a coating of aluminum oxide can be formed by several dry process methods including, for example, CVD (chemical vapor deposition), plasma CVD, ion plating, sputtering and the like. At any rate, the coating layer of aluminum oxide formed on the aluminum plate has a very high adhesive bonding strength to the substrate surface without danger of peeling or exfoliation and exhibits high resistances against heat, chemicals and water or moisture.

The second coating layer formed on the layer of aluminum oxide is a layer of an amorphous silicon carbide. Such an amorphous silicon carbide is known in the art to be produced by several methods using, for example, a monosilane compound and a carbon-containing compound as a combination of the starting materials in the CVD, plasma CVD, ion plating, sputtering and the like methods. Although any of the above mentioned methods is applicable to the formation of the layer of an amorphous silicon carbide, it is essential that the molar ratio of silicon to carbon in the amorphous silicon carbide should be in the range from 1:2 to 1:9 and the layer of the amorphous silicon carbide should have an electric volume resistivity of at least $10^{12}$ ohm.cm. In this regard, the volume resistivity of crystalline silicon carbides is too low so that the crystalline silicon carbide cannot be a substitute for the amorphous silicon carbide in the present invention.

The thickness of each of the coating layers of the aluminum oxide and amorphous silicon carbide should be determined in consideration of the thermal conductivity of the resultant laminate and other requirements while the layer of aluminum oxide should have a thickness in the range from 20 to 60 $\mu$m and the layer of the amorphous silicon carbide should have a thickness in the range from 5 to 20 $\mu$m. The coating treatments to form these coating layers should be performed at a relatively low temperature of 400° C. or below in consideration of the difference in the thermal expansion coefficients between the layers or between the coating layers and the aluminum substrate.

The aluminum substrate plate thus successively provided with the laminating layers of an aluminum oxide layer and an amorphous silicon carbide layer is further overlaid with a copper foil which is adhesively bonded to the surface of the amorphous silicon carbide layer by use of a suitable adhesive such as epoxy resin-based ones to give a finished copper-foiled laminate for base plate having a good thermal conductivity and excellent resistance against chemicals and water or moisture.

Different from conventional copper-foiled laminated base plates, the inventive copper-foiled laminate having the above described layered structure can exhibit good heat dissipation by itself with a high thermal conductivity in addition to the advantages that the laminate as finished has a high cleanness on the surface with a very small number of pinholes.

In the following, the inventive copper-foiled laminates are described in more detail by way of examples although the scope of the present invention is not limited thereby in any way.

EXAMPLE 1

An aluminum plate having a thickness of 0.7 mm was coated with an aluminum oxide layer having a thickness of 10 $\mu$m by the method of ion plating. Thereafter, a layer of an amorphous silicon carbide having a thickness of 10 μm was formed on the aluminum oxide layer by the method of plasma CVD using tetramethyldisilane as the reactant gas diluted with hydrogen gas as a carrier and introduced into the plasma chamber kept at a pressure of about 0.03 Torr with supply of a high frequency electric power to the electrodes to generate low temperature plasma of the gas. The amorphousness of the coating layer of the silicon carbide was confirmed by the X-ray diffraction Auger spectroscopy. Further, a copper foil having a thickness of 0.070 mm was adhesively bonded to the top surface of the amorphous silicon carbide layer by use of an epoxy resin-based adhesive to give a copper-foiled laminate.

The thus prepared laminate was tested for the heat resistance, chemical resistance, water resistance and burning resistance according to the procedures specified in JIS C 6480 (1965) for copper-foiled laminates for printed circuit board to give the results below. The electric insulation was evaluated by the determination of the volume resistivity according to the procedure specified in JIS C 6481 (1976).

Heat resistance: test passed at 180° C. with the whole body including the epoxy resin-based adhesive.
Electric insulation: $10^{12}$ ohm.cm.
Chemical resistance: good.
Water absorption: 0% excepting the epoxy resin-based adhesive.
Burning resistance: incombustible excepting the epoxy resin-based adhesive.

These results support that this laminate satisfies the standards specified in the above mentioned JIS Specifications.

In addition, the thermal conductivity of the copper-foiled laminate was evaluated and compared with that of a laminate without the amorphous silicon carbide layer by placing a drop of molten solder alloy at 260° C. having a diameter of about 5 mm on the copper foil and measuring the time taken for the decrease of the temperature of the copper foil to 30° C. in an ambient condition. The results were that the time was 86 seconds in the inventive laminate and the time was 148 seconds in the comparative laminate.

EXAMPLE 2

An aluminum plate having a thickness of 2.0 mm was provided with a porous coating layer of aluminum oxide having a thickness of 20 μm by the method of electrolytic anodization. Thereafter, a coating layer of an amorphous silicon carbide having a thickness of 20 μm was formed on the oxide layer by the plasma CVD method in a similar manner to Example 1. The amorphousness of this silicon carbide layer was confirmed in the same manner as in Example 1. Further, a copper foil having a thickness of 0.070 mm was adhesively bonded to the layer of the amorphous silicon carbide by use of an epoxy resin-based adhesive to give a copper-foiled laminate which was tested in the same manner as in Example 1 for the evaluation as a base plate of printed circuit boards to give the results as follows.

Heat resistance: test passed at 180° C. with the whole body.
Electric insulation: $10^{12}$ ohm.cm.
Chemical resistance: good.
Water absorption: 0%.
Burning resistance: incombustible excepting the epoxy resin-based adhesive.

These results support that this laminate satisfies the standards specified in the above mentioned JIS Specifications.

What is claimed is:
1. A copper-foiled laminate which comprises:
   (a) an aluminum plate as a base;
   (b) a layer of aluminum oxide formed on the surface of the aluminum plate;
   (c) a layer of an amorphous silicon carbide formed on the surface of the layer of aluminum oxide; and
   (d) a copper foil adhesively bonded to the surface of the layer of the amorphous silicon carbide by use of an adhesive.
2. The copper-foiled laminate as claimed in claim 1 wherein the thickness of the layer of aluminum oxide is in the range from 20 to 60 μm.
3. The copper-foiled laminate as claimed in claim 1 wherein the thickness of the layer of the amorphous silicon carbide is in the range from 5 to 20 μm.
4. The copper-foiled laminate as claimed in claim 1 wherein the molar ratio of silicon to carbon in the amorphous silicon carbide is in the range from 1:2 to 1:9.

* * * * *